(12) United States Patent
Yokoyama et al.

(10) Patent No.: US 9,536,997 B1
(45) Date of Patent: Jan. 3, 2017

(54) SEMICONDUCTOR DEVICE

(71) Applicant: KABUSHIKI KAISHA TOSHIBA, Tokyo (JP)

(72) Inventors: Noboru Yokoyama, Kanazawa Ishikawa (JP); Shinya Sato, Nonoichi Ishikawa (JP); Tomoyuki Sakuma, Nonoichi Ishikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/056,896

(22) Filed: Feb. 29, 2016

(30) Foreign Application Priority Data

Sep. 10, 2015 (JP) ................. 2015-178458

(51) Int. Cl.
*H01L 29/78* (2006.01)

(52) U.S. Cl.
CPC ....... *H01L 29/7802* (2013.01); *H01L 29/7827* (2013.01); *H01L 29/7813* (2013.01)

(58) Field of Classification Search
CPC ............ H01L 29/0634; H01L 29/7802; H01L 29/7827; H01L 29/78642; H01L 29/7813; H01L 29/1037; H01L 29/78618; H01L 29/4236; H01L 29/66712
See application file for complete search history.

(56) References Cited

U.S. PATENT DOCUMENTS

| | | | | |
|---|---|---|---|---|
| 7,482,220 B2* | 1/2009 | Loechelt | ............... | H01L 21/761 257/328 |
| 7,843,004 B2* | 11/2010 | Darwish | ............... | H01L 29/407 257/329 |
| 7,902,075 B2* | 3/2011 | Grivna | ............... | H01L 21/76232 257/301 |
| 8,659,074 B2* | 2/2014 | Darwish | ............ | H01L 29/0649 257/329 |
| 9,219,114 B2* | 12/2015 | Cheng | ................. | H01L 29/0649 |
| 2010/0181640 A1 | 7/2010 | Shiromoto et al. | | |
| 2013/0153995 A1* | 6/2013 | Misawa | ............... | H01L 29/407 257/330 |
| 2014/0346588 A1* | 11/2014 | Morale | ............... | H01L 29/1095 257/329 |

FOREIGN PATENT DOCUMENTS

| | | |
|---|---|---|
| JP | 5194912 B2 | 5/2013 |
| JP | 2014075402 A | 4/2014 |
| JP | 2015056639 A | 3/2015 |

* cited by examiner

*Primary Examiner* — William Coleman
(74) *Attorney, Agent, or Firm* — Patterson & Sheridan, LLP

(57) ABSTRACT

A semiconductor device includes a semiconductor layer of a first conductivity type, a plurality of first regions that are spaced apart from each other along a first direction by portions of the semiconductor layer, each of the first regions including a first semiconductor region of a second conductivity type, a second region between the first regions in the first direction, the second region including a second semiconductor region of the first conductivity type and a first insulator between the second semiconductor region and the semiconductor layer, and a third region between the first region and the second region, the third region including a third semiconductor region of the first conductivity type and a second insulator.

20 Claims, 18 Drawing Sheets

9,536,997 B1

SEMICONDUCTOR DEVICE

CROSS-REFERENCE TO RELATED APPLICATION

This application is based upon and claims the benefit of priority from Japanese Patent Application No. 2015-178458, filed on Sep. 10, 2015, the entire contents of which are incorporated herein by reference.

FIELD

Embodiments described herein relate generally to a semiconductor device.

BACKGROUND

A vertical metal oxide semiconductor field effect transistor (MOSFET), in which a p type (or n type) semiconductor layer is buried in an n type (or p type) semiconductor layer, and which has a super junction structure (hereinafter, also referred to as a SJ structure) having an n type region and a p type region that are alternately arranged, has been used as a power control semiconductor device that has a high breakdown voltage and a low ON resistance. In the SJ structure, the amount of n type impurities which is included in the n type region is equal to the amount of p type impurities which is included in the p type region, whereby an undoped region is simultaneously formed and a high breakdown voltage is achieved. Since impurity concentration of a semiconductor layer is increased by an increase of the breakdown voltage of the semiconductor device, it is possible to achieve an increase in the breakdown voltage and a low ON resistance.

A method for forming the SJ structure includes, for example, a method in which a trench is formed in an n type semiconductor layer, and a p type semiconductor is buried in the trench to form a p type semiconductor layer. However, in this method, a hollow portion (e.g., hole or void) is easily formed inside the p type semiconductor layer.

DETAILED DESCRIPTION

Figure 1:
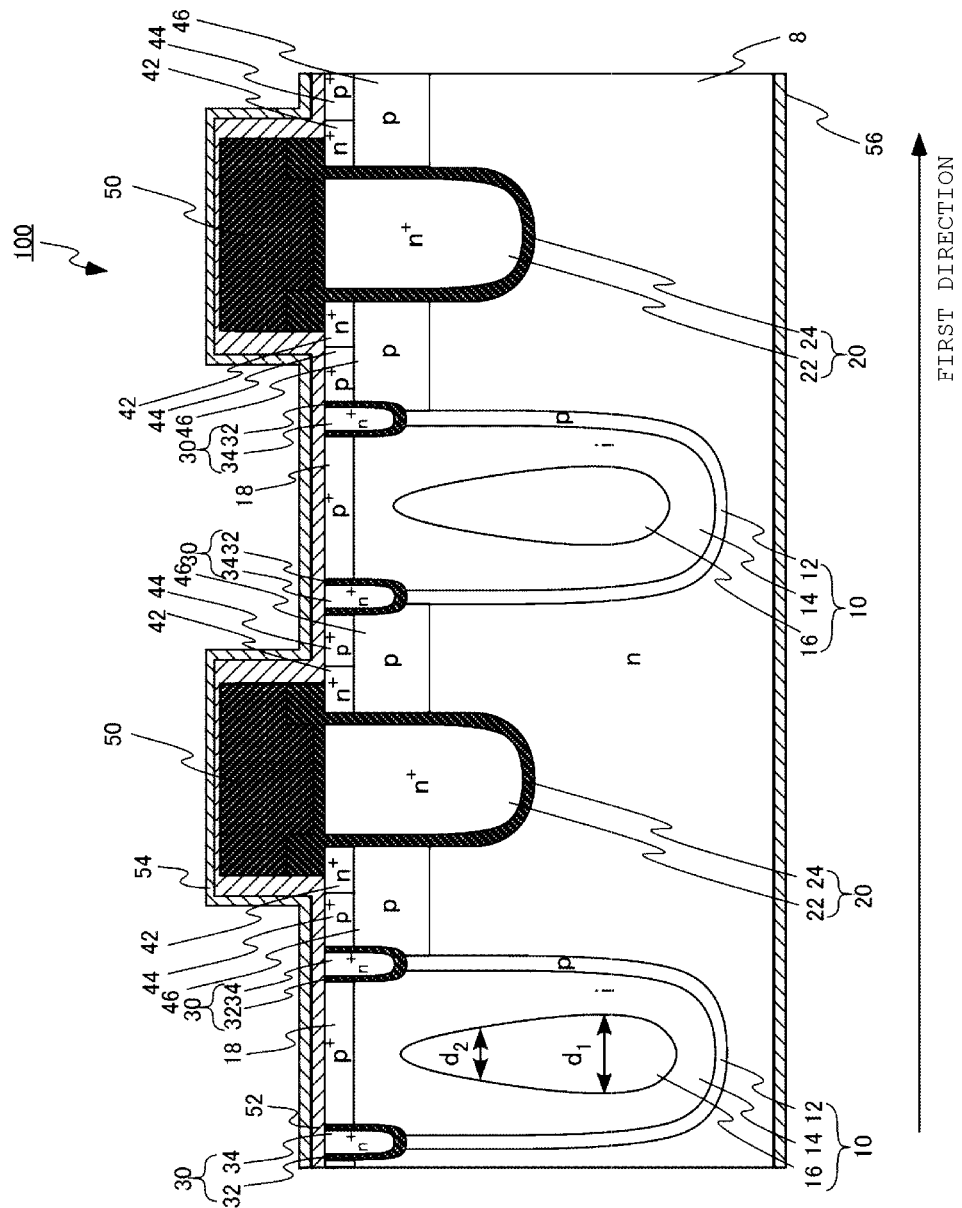
FIG. 1 is a sectional view of a semiconductor device according to a first embodiment.

Embodiments provide a semiconductor device which can suppress degradation of characteristics of a super junction structure.

In general, according to one embodiment, a semiconductor device includes a semiconductor layer of a first conductivity type, a plurality of first regions that are spaced apart from each other along a first direction by portions of the semiconductor layer, each of the first regions including a first semiconductor region of a second conductivity type, a second region between the first regions in the first direction, the second region including a second semiconductor region of the first conductivity type and a first insulator between the second semiconductor region and the semiconductor layer, and a third region between the first region and the second region, the third region including a third semiconductor region of the first conductivity type and a second insulator.

Embodiments will now be described with reference to the drawings. In the following description, the same symbols or reference numerals will be attached to the same elements, and description of elements described once will not be repeated.

In the disclosure, an upward direction of the drawing is referred to as "upper", and a downward direction of the drawing is referred to as "lower", in order to represent a positional relationship of components. In the disclosure, the terms "upper" and "lower" do not necessarily represent directions defined with respect to gravity.

First Embodiment

A semiconductor device according to the first embodiment includes a semiconductor layer of a first conductivity type, a plurality of first regions that are spaced apart from each other along a first direction by portions of the semiconductor layer, each of the first regions including a first semiconductor region of a second conductivity type, a second region between the first regions in the first direction, the second region including a second semiconductor region of the first conductivity type and a first insulator between the second semiconductor region and the semiconductor layer, and a third region between the first region and the second region, the third region including a third semiconductor region of the first conductivity type and a second insulator: a first conductive type semiconductor layer; a plurality of first regions that are positioned to alternate with a portion of the semiconductor layer in a first direction of the semiconductor layer, and includes a second conductive type impurity region; a second region that is positioned between the first regions in the first direction, and includes a first conductive type impurity region and a first insulator material that is positioned between the first conductive type impurity region and the semiconductor layer; and a third region that is provided between the first region and the second region, and includes a second insulator material.

FIG. 1 is a cross sectional view of the semiconductor device according to the first embodiment. A semiconductor device 100 according to the first embodiment is a vertical MOSFET of a trench gate type which has a super junction structure.

The semiconductor device 100 includes a first conductive type semiconductor layer 8, a first region 10 that includes a seventh semiconductor region 12 of a second conductive type, an eighth semiconductor region 14 and an empty hole 16, a third semiconductor region 18 of a second conductive type, a second region 20 that includes a fourth semiconductor region 22 of a first conductive type and a first insulator material 24, a third region 30 that includes a second insulator material 32 and a fifth semiconductor region 34 of a first conductive type, a first semiconductor region 42 of a first conductive type, a second semiconductor region 44 of a second conductive type, a sixth semiconductor region 46 of a second conductive type, a third insulator material 50, a barrier metal 52, a source electrode 54, and a drain electrode 56.

Hereinafter, a case in which a first conductive type is an n type and a second conductive type is a p type will be described as an example. In addition, impurity concentration of a first conductive type decreases in the order of n$^+$ type, an n type, and an n$^-$ type. In the same manner, impurity concentration of a second conductive type decreases in the order of a p⁺ type, a p type, and a p⁻ type.

The n type semiconductor layer 8 comprises a single crystalline silicon layer containing, for example, an n type impurity. The n type semiconductor layer 8 is a drift region of the semiconductor device 100. The n type impurity is, for example, phosphorus (P) or arsenic (As). The n type semiconductor layer 8 is a portion of an n type region of the super junction structure.

A plurality of first regions 10 are provided so as to alternate with a portion of the n type semiconductor layer 8 in a first direction of the semiconductor layer 8. A p type impurity region and a semiconductor material are provided in the plurality of first regions 10. The p type impurity is, for example, boron (B). The semiconductor material is, for example, silicon (Si). The plurality of first regions 10 is a portion of the p type region of the super junction structure.

The plurality of first regions 10 includes the eighth semiconductor region 14 having the empty hole (void) 16 therein, the seventh semiconductor region 12 of a p type which is provided around the eighth semiconductor region 14, and the third semiconductor region 18 of a p⁺ type which is provided on the eighth semiconductor region 14. The seventh semiconductor region 12 and the eighth semiconductor region 14 are positioned inside the n type semiconductor layer 8, and the third semiconductor region 18 is positioned on one surface of the n type semiconductor layer 8. The eighth semiconductor region 14 includes Si of an i type (undoped). A diameter $d_1$ of a lower portion of the empty hole 16 is greater than a diameter $d_2$ of an upper portion of the empty hole 16. That is, the empty hole 16 is formed so that an inner diameter positioned on the third semiconductor region 18 side is smaller than that positioned on the n type semiconductor layer 8 side. The seventh semiconductor region 12 is in contact with, for example, the semiconductor layer 8, the eighth semiconductor region 14, and the sixth semiconductor region 46.

The second region 20 is provided between the first regions 10 adjacent to each other in the first direction. A semiconductor material and a first insulator material are provided in the second region 20. The semiconductor material is, for example, silicon (Si). The first insulator material is, for example, a silicon oxide ($SiO_2$).

The second region 20 includes the fourth semiconductor region 22 of an n⁺ type, and the first insulator material 24 provided around the fourth semiconductor region 22. The fourth semiconductor region 22 includes an n type impurity and the semiconductor material. The fourth semiconductor region 22 operates as a gate electrode. The first insulator material 24 is in contact with the semiconductor layer 8 and the fourth semiconductor region 22.

The third region 30 is provided between the first region and the second region 20. For example, the fifth semiconductor region 34 of an n⁺ type and the second insulator material 32 positioned around the fifth semiconductor region 34 are provided in the third region 30. The second insulator material 32 is positioned on one surface of the n type semiconductor layer 8, and is in contact with the seventh semiconductor region 12 and the third semiconductor region 18. The second insulator material is, for example, a silicon oxide ($SiO_2$). The second insulator material 32 is in contact with, for example, the fifth semiconductor region 34.

The first semiconductor region 42 of an n⁺ type is positioned between the second region 20 and the third region 30, and is provided on one surface of the n type semiconductor layer 8. The first semiconductor region 42 is in contact with the first insulator material 24 and operates as a source region of the semiconductor device 100.

The second semiconductor region 44 of a p⁺ type is provided between the third region 30 and the first semiconductor region 42. The second semiconductor region 44 operates as a channel contact region (base contact region) of the semiconductor device 100.

The sixth semiconductor region 46 of a p type is provided under the first semiconductor region 42 and the second semiconductor region 44 which are positioned between the second region 20 and the third region 30. That is, the sixth semiconductor region 46 is positioned between the n type semiconductor layer 8, and the first semiconductor region 42 and the second semiconductor region 44. The sixth semiconductor region 46 is in contact with the first insulator material 24, and operates as a channel region (base region) of the semiconductor device 100.

The third insulator material 50 is provided on the n type semiconductor layer 8 in the second region 20. The third insulator material 50 ensures insulation properties between the source electrode 54 and the fourth semiconductor region 22 of an n type which will be described below. The third insulator material 50 includes, for example, non-doped silicate glass (NSG) or boro-phospho silicate glass (BPSG).

The barrier metal 52 is provided above the first region 10, the second region 20, the third region 30, the first semiconductor region 42, the second semiconductor region 44, and the third insulator material 50. The barrier metal 52 prevents aluminum (Al) (used for the source electrode 54) and silicon from diffusing into each other due to direct contact. The barrier metal 52 includes, for example, titanium nitride (TiN), titanium (Ti), or titanium tungsten (TiW).

The source electrode 54 is provided on the barrier metal 52. The drain electrode 56 is provided under the n type semiconductor layer 8, and is electrically connected to the n type semiconductor layer 8.

Next, a fabrication method of the semiconductor device 100 according to the present embodiment will be described. FIG. 2 to FIG. 17 are cross sectional views of the semiconductor device during the semiconductor device fabrication method according to the present embodiment.

In the fabrication method of the semiconductor device 100 according to the present embodiment, a first oxide film 60 is formed on an n type semiconductor layer 8, and a plurality of first regions 10 are formed in the semiconductor layer 8 along a first direction. A seventh semiconductor region 12 of a p type, an eighth semiconductor region 14, and an empty hole 16 are formed inside the first region 10. The surplus eighth semiconductor region 14 formed on the first oxide film 60 is removed, and the first oxide film 60 is removed. Then, a second oxide film 62 is formed on the semiconductor layer 8, the seventh semiconductor region 12, and the eighth semiconductor region 14, and thereafter, the second oxide film 62 is removed such that a side wall formed on a side surface of the seventh semiconductor region 12 remains, and a ninth semiconductor region 46 of a p type is formed on the semiconductor layer 8, the seventh semiconductor region 12, the eight semiconductor region 14, and the side wall 62. Then, the ninth semiconductor region 46 formed on the side wall, the seventh semiconductor region 12, and the eight semiconductor region 14 is removed, and a third oxide film 64 is formed on the ninth semiconductor region, and a CVD film M on the third oxide film 64. Then, a first opening having a bottom portion on the ninth semiconductor region 46 and a second opening having a bottom portion inside the semiconductor layer 8 are formed. The second opening is chamfered, and a third opening which becomes a third region is formed by removing the CVD film M and the third oxide film 64. Then, a fourth oxide film 66 is formed inside the second opening and the third opening, and on the ninth semiconductor region 46, and polycrystalline silicon is formed inside the second opening and the third opening, such that a fourth semiconductor region 22 of an n type is formed inside the second region 20 and a fifth semiconductor region 34 of an n type is formed inside the third region by doping an n type impurity in the polycrystalline silicon. Then, a fifth oxide film 68 is formed on the fourth oxide film 66, the fourth semiconductor region 22, and the fifth semiconductor region 34, and a third semiconductor region 18 of a p$^+$ type is formed on the eighth semiconductor region 14, and a second semiconductor region 44 of a p$^+$ type is formed between the first region 10 and the second region 20 by implanting p type impurities into these regions. Thereafter, the p type impurity is diffused. Then, a first semiconductor region 42 of an n$^+$ type is formed between the first region 10 and the second region 20 by implanting n type impurities into this region, so that a sixth semiconductor region 46 of a p type is under the first semiconductor region 42 and the second semiconductor region 44. Thereafter, the n type impurity is diffused. Then, a film is formed on the fifth oxide film 68, and thermal processing is performed. Then, a third insulator material 50 is formed on the second region by removing a portion of the film 20, and a barrier metal 52 is formed on the first region 10, the second region 20, the third region 30, the first semiconductor region 42, the second semiconductor region 44, and the third insulator material 50, and a source electrode 54 is formed on the barrier metal 52, and a drain electrode 56 is formed under the semiconductor layer 8.

Figure 2:
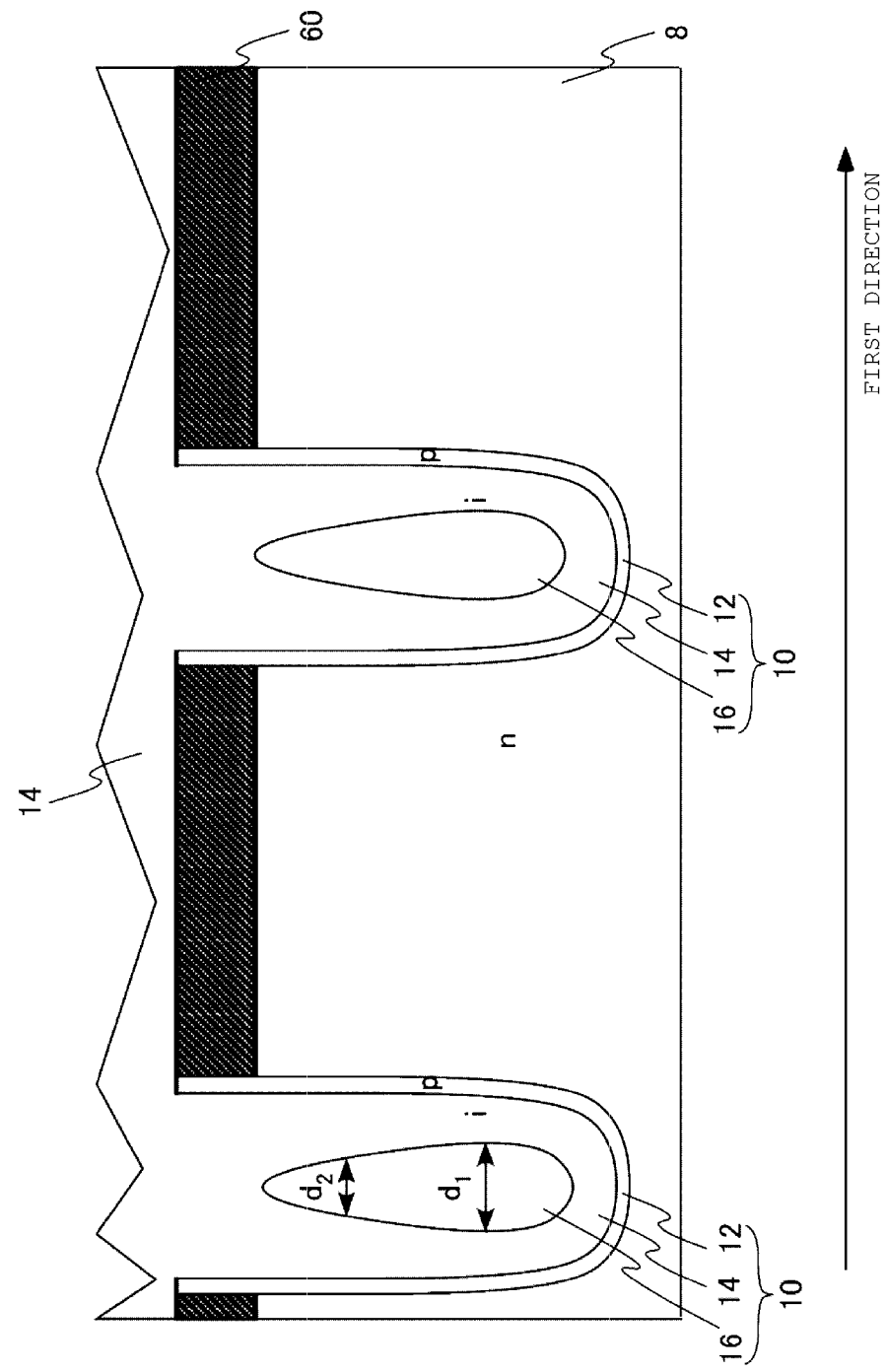
FIGS. 2-17 are sectional views of a semiconductor device structure resulting after carrying out different steps of a semiconductor device fabrication method according to the first embodiment.

First, as illustrated in FIG. 2, a first oxide film 60 is formed on the n type semiconductor layer 8 through, for example, a thermal oxide method, the plurality of first regions 10 are formed on the semiconductor layer 8 in the first direction through, for example, reactive ion etching (RIE), and the seventh semiconductor region 12 of a p type is formed inside the first region 10 through, for example, epitaxial growth. Subsequently, the eighth semiconductor region 14 is formed inside the first region 10. At this time, the empty hole 16 having the diameter $d_1$ of a lower portion larger than the diameter $d_2$ of an upper portion is formed inside the first region 10.

Figure 3:
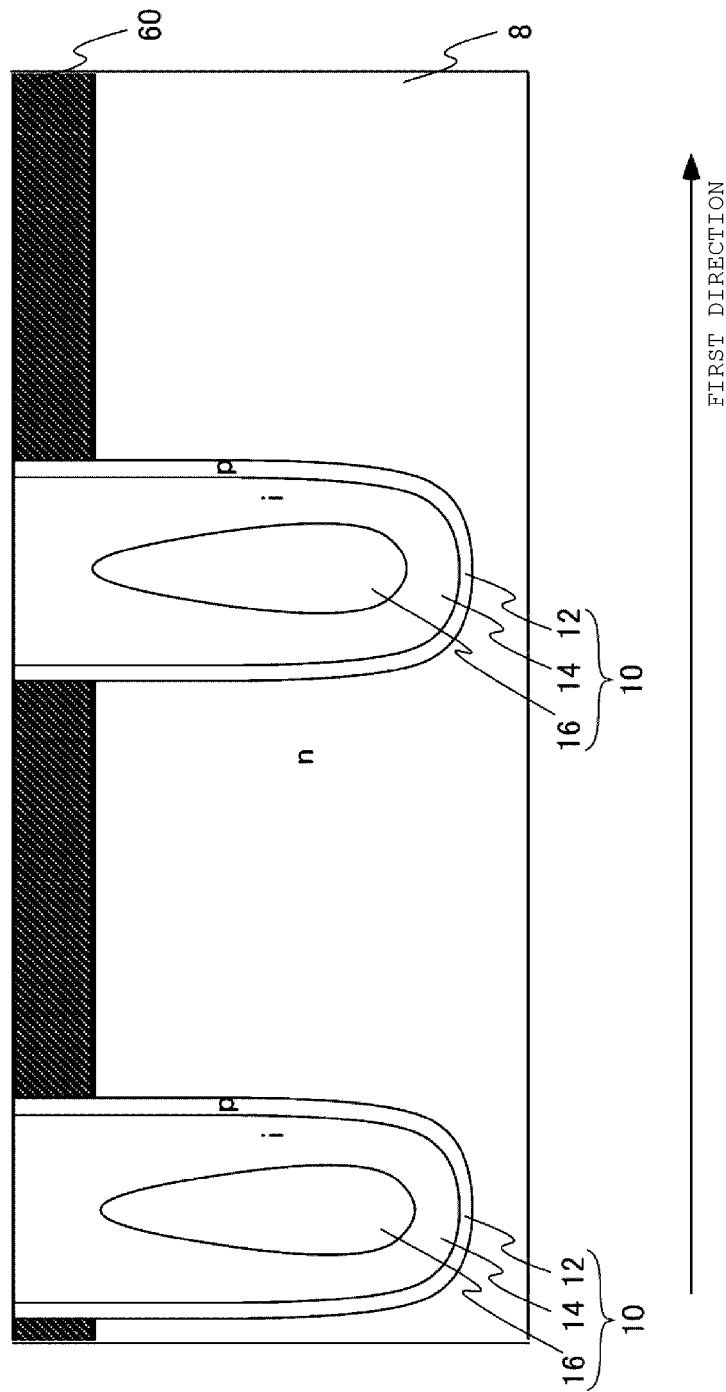

Subsequently, as illustrated in FIG. 3, the surplus eighth semiconductor region 14 formed on a first oxide film 60 is removed by chemical mechanical polishing (CMP) using the first oxide film 60 as a CMP stopper.

Figure 4:
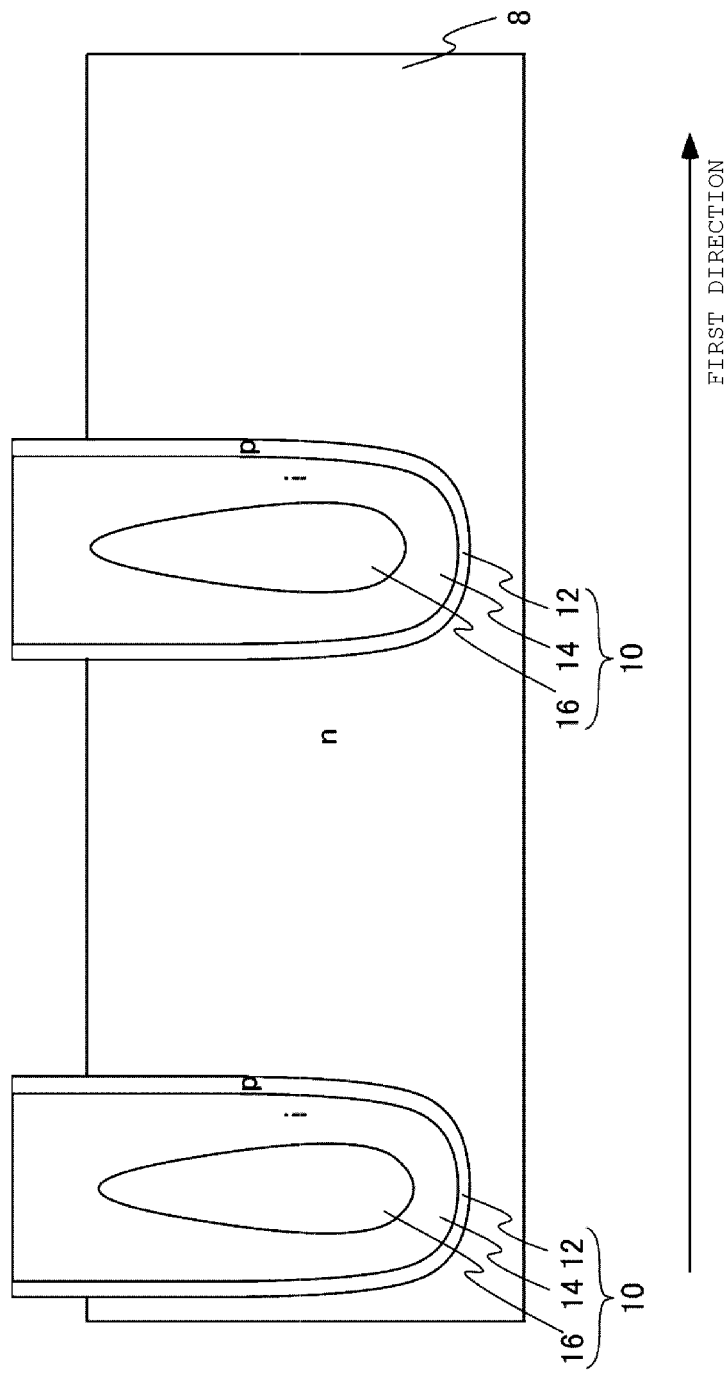

Subsequently, as illustrated in FIG. 4, the first oxide film 60 is removed by using, for example, a mixture of hydrofluoric acid and hydrogen peroxide solution.

Figure 5:
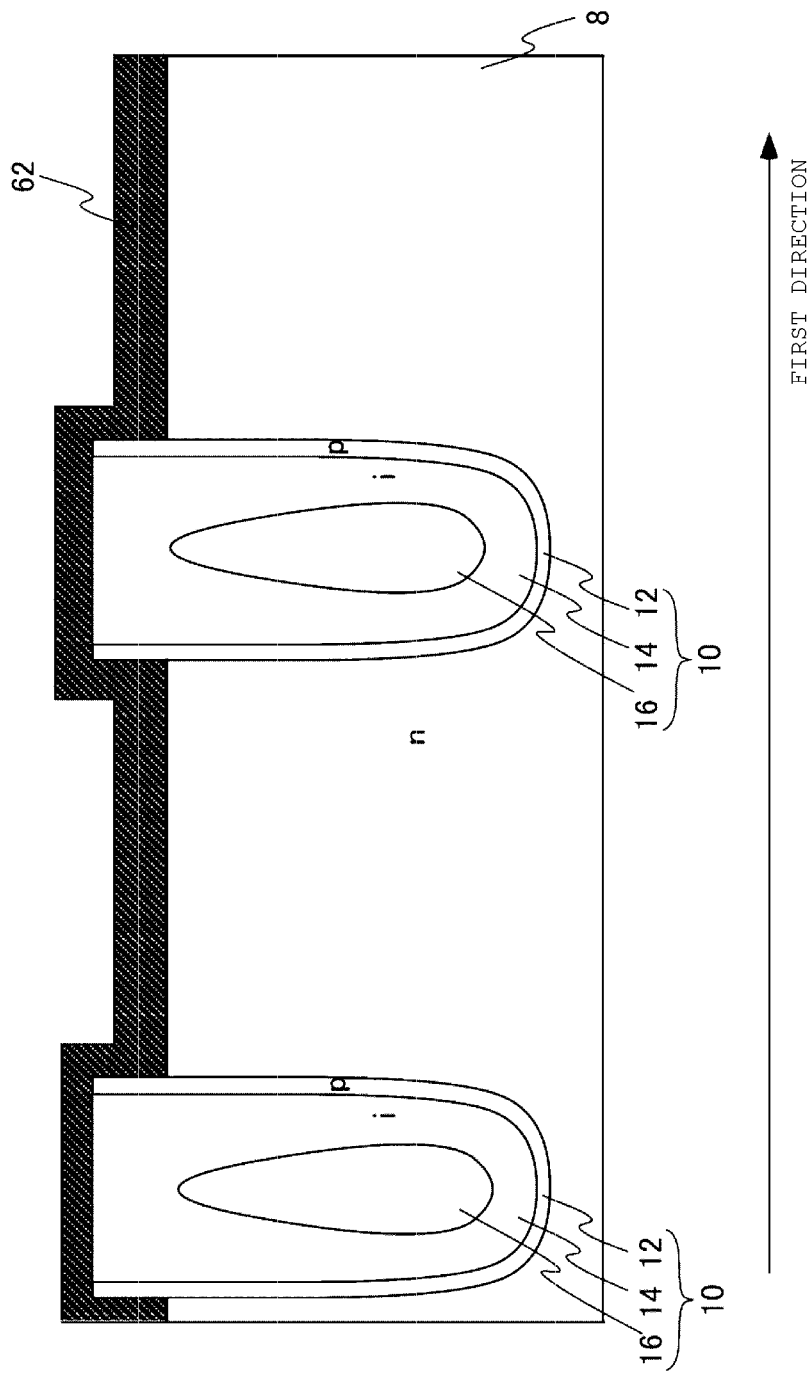

Subsequently, as illustrated in FIG. 5, a second oxide film 62 is formed on the semiconductor layer 8 and the eighth semiconductor region 14 through, for example, a thermal oxide method or a chemical vapor deposition (CVD) method.

Figure 6:
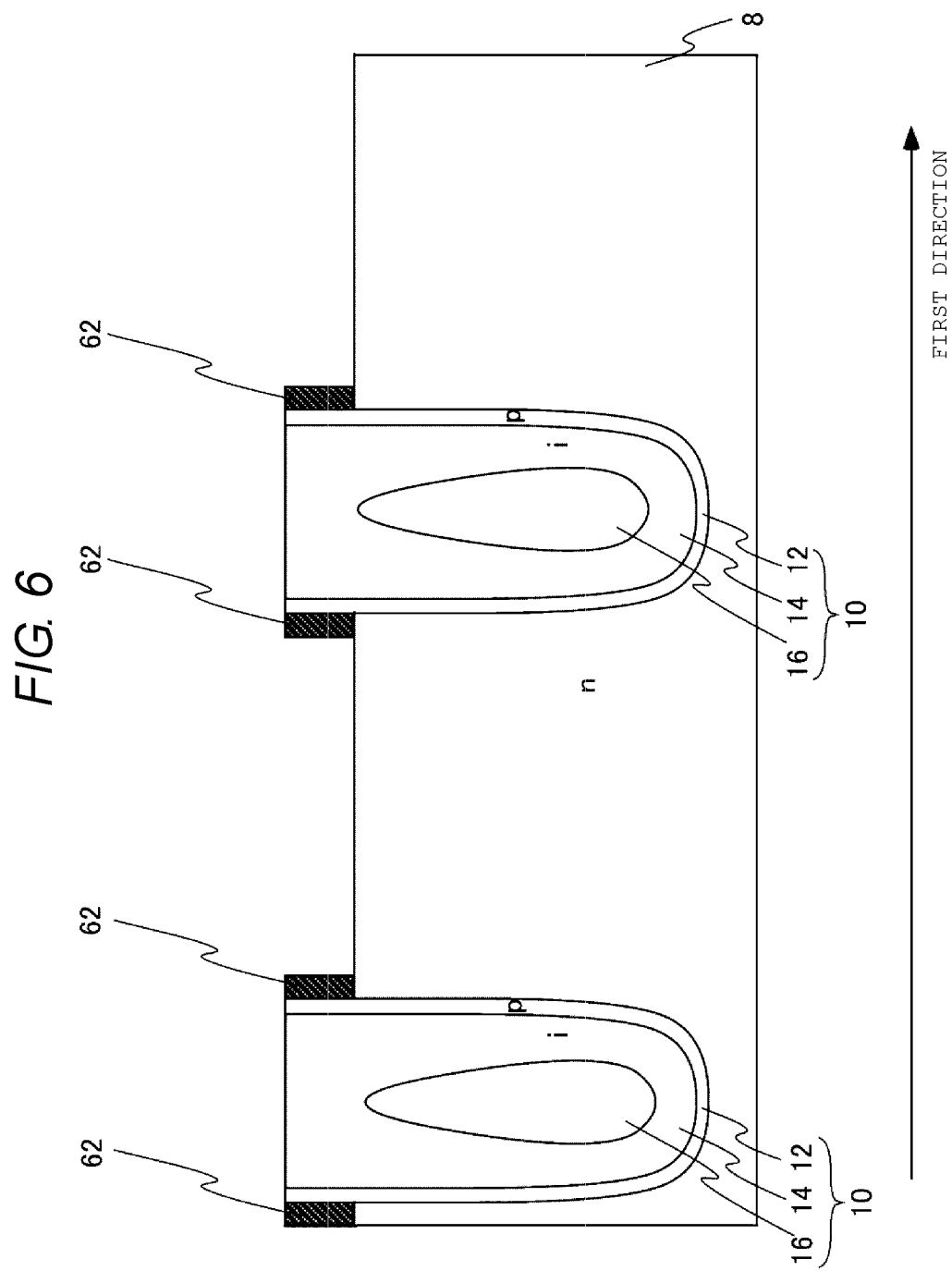

Subsequently, as illustrated in FIG. 6, the second oxide film 62 is removed through, for example, RIE, such that the side wall 62 formed on a side surface of the seventh semiconductor region 12 remains.

Figure 7:
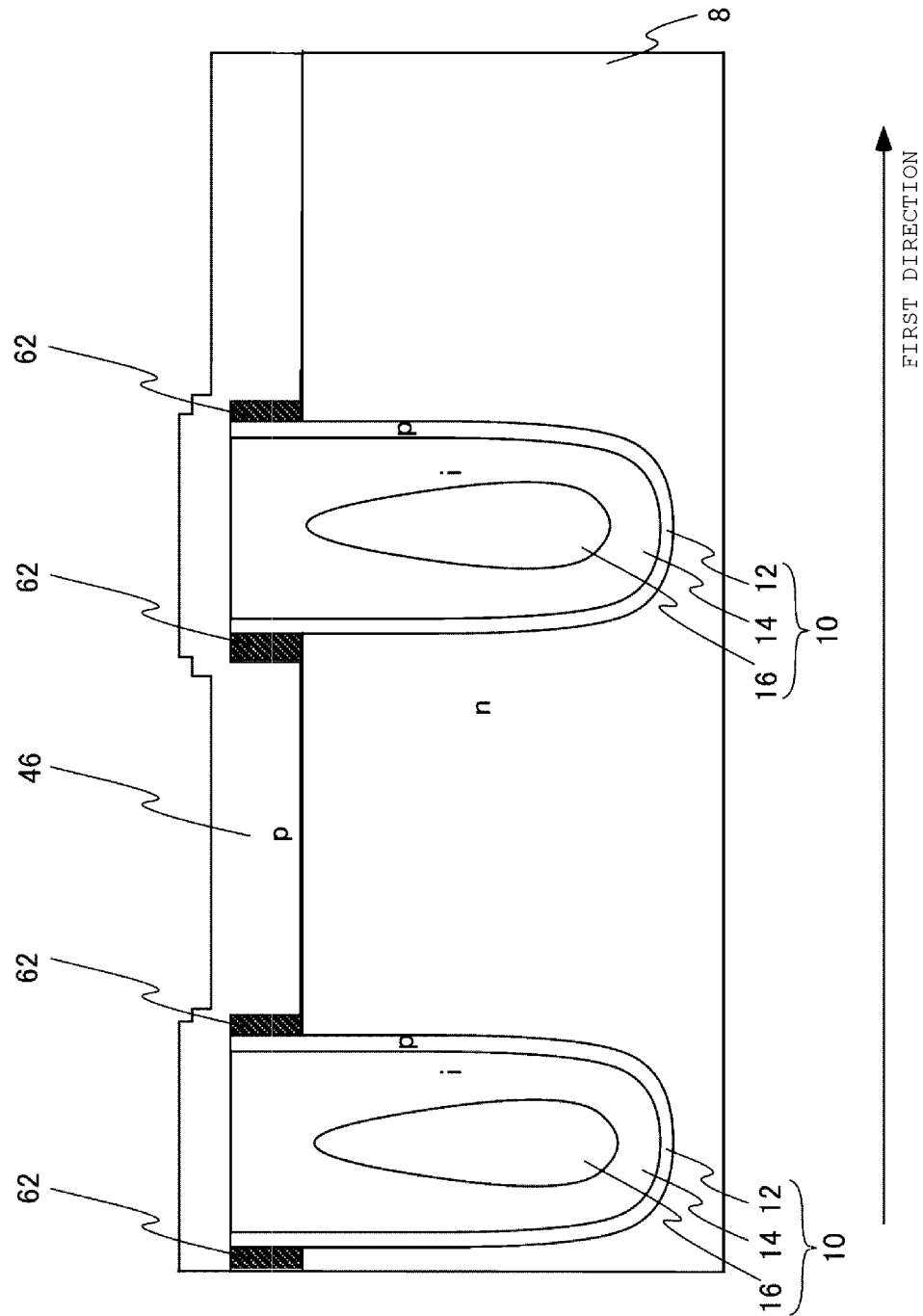

Subsequently, as illustrated in FIG. 7, the sixth semiconductor region 46 of a p type is formed on the semiconductor layer 8, the eighth semiconductor region 14, the seventh semiconductor region 12, and the side wall 62 through, for example, epitaxial growth.

Figure 8:
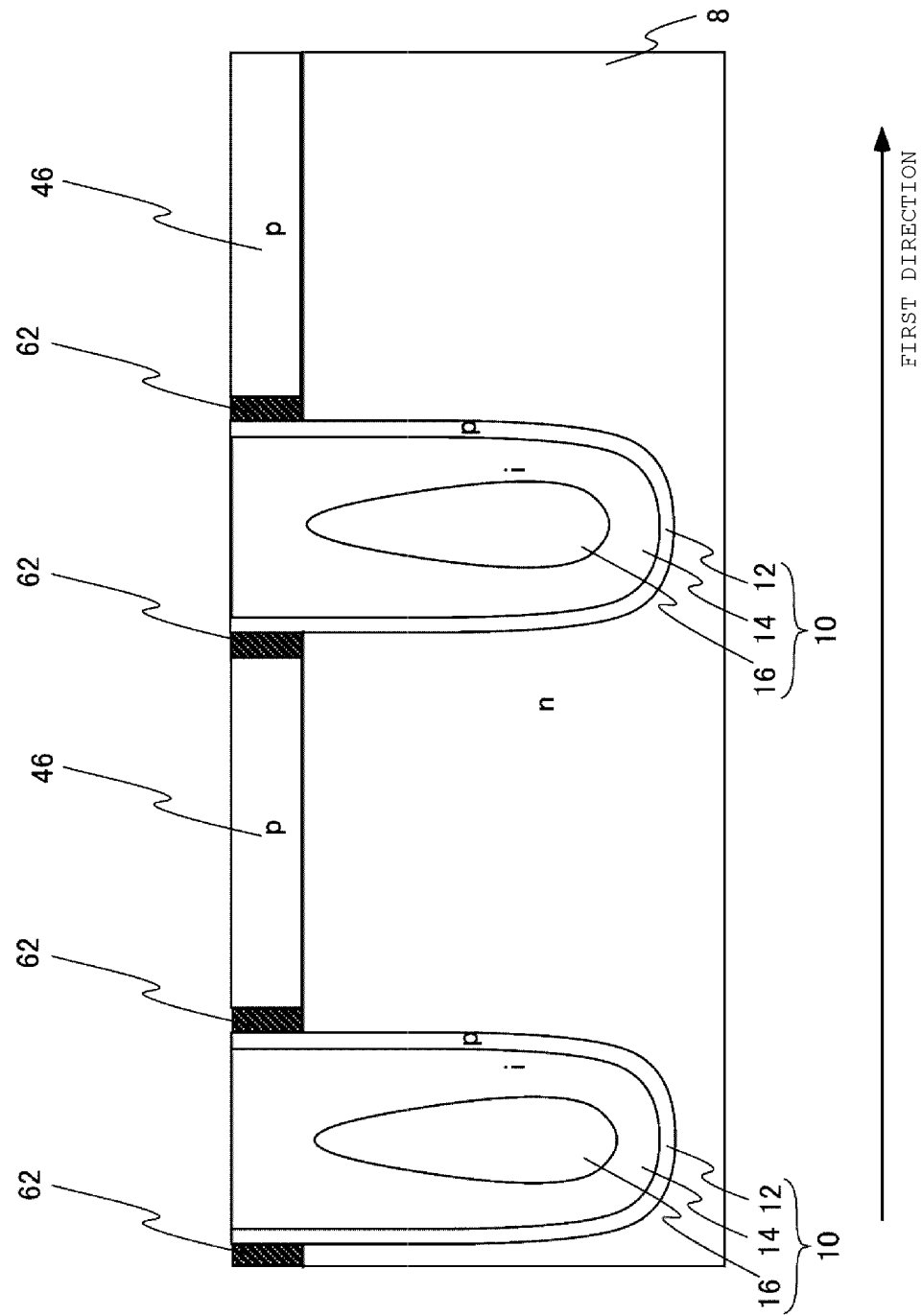

Subsequently, as illustrated in FIG. 8, the sixth semiconductor region 46 of a p type formed on the side wall 62 and the seventh semiconductor region 12 is removed by chemical mechanical polishing (CMP) using the side wall 62 as a CMP stopper.

Figure 9:
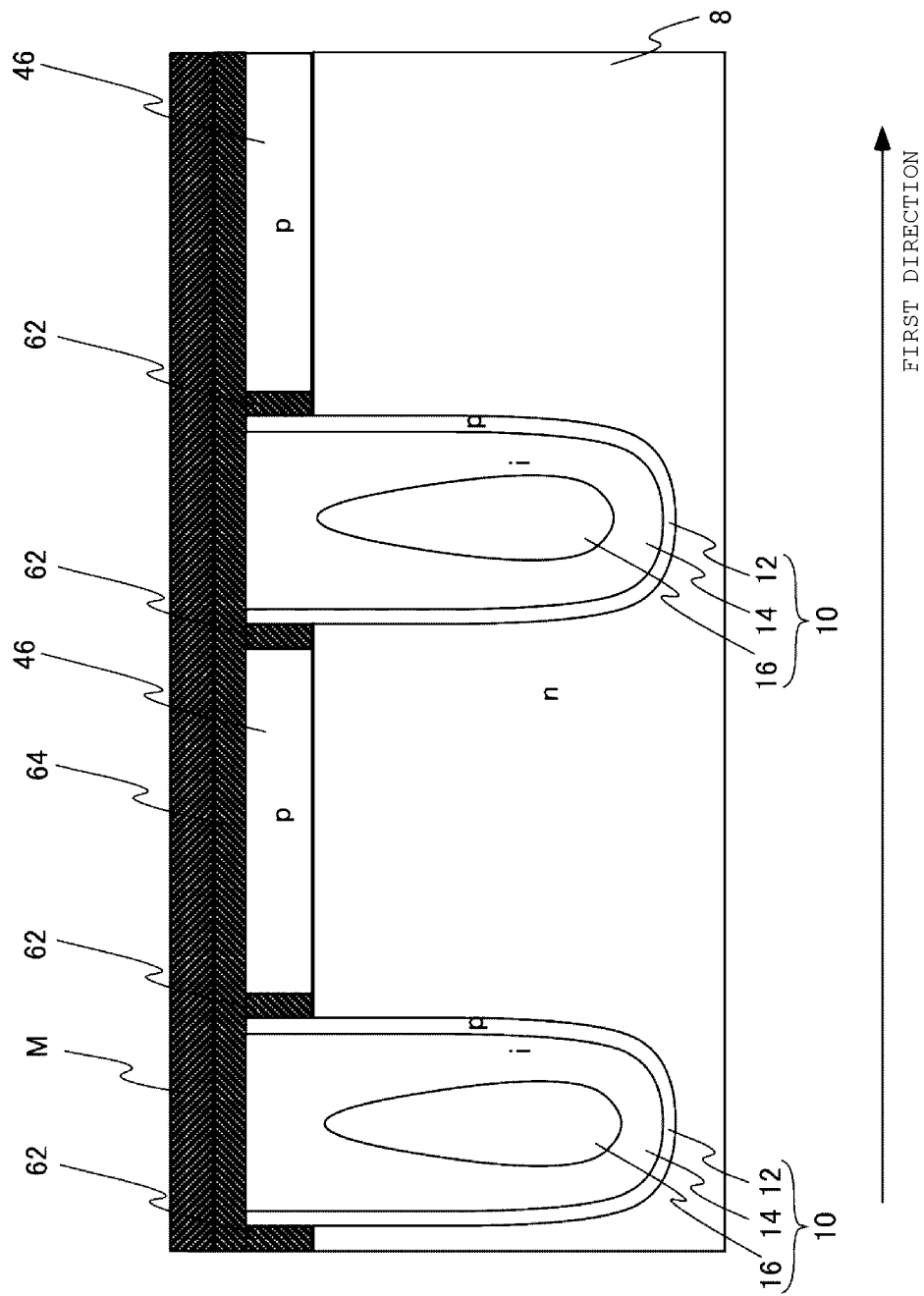

Subsequently, as illustrated in FIG. 9, a third oxide film 64 is formed on the sixth semiconductor region 46 of a p type through a thermal oxide method, and a CVD film M is formed on the third oxide film 64 through, for example, a CVD method.

Figure 10:
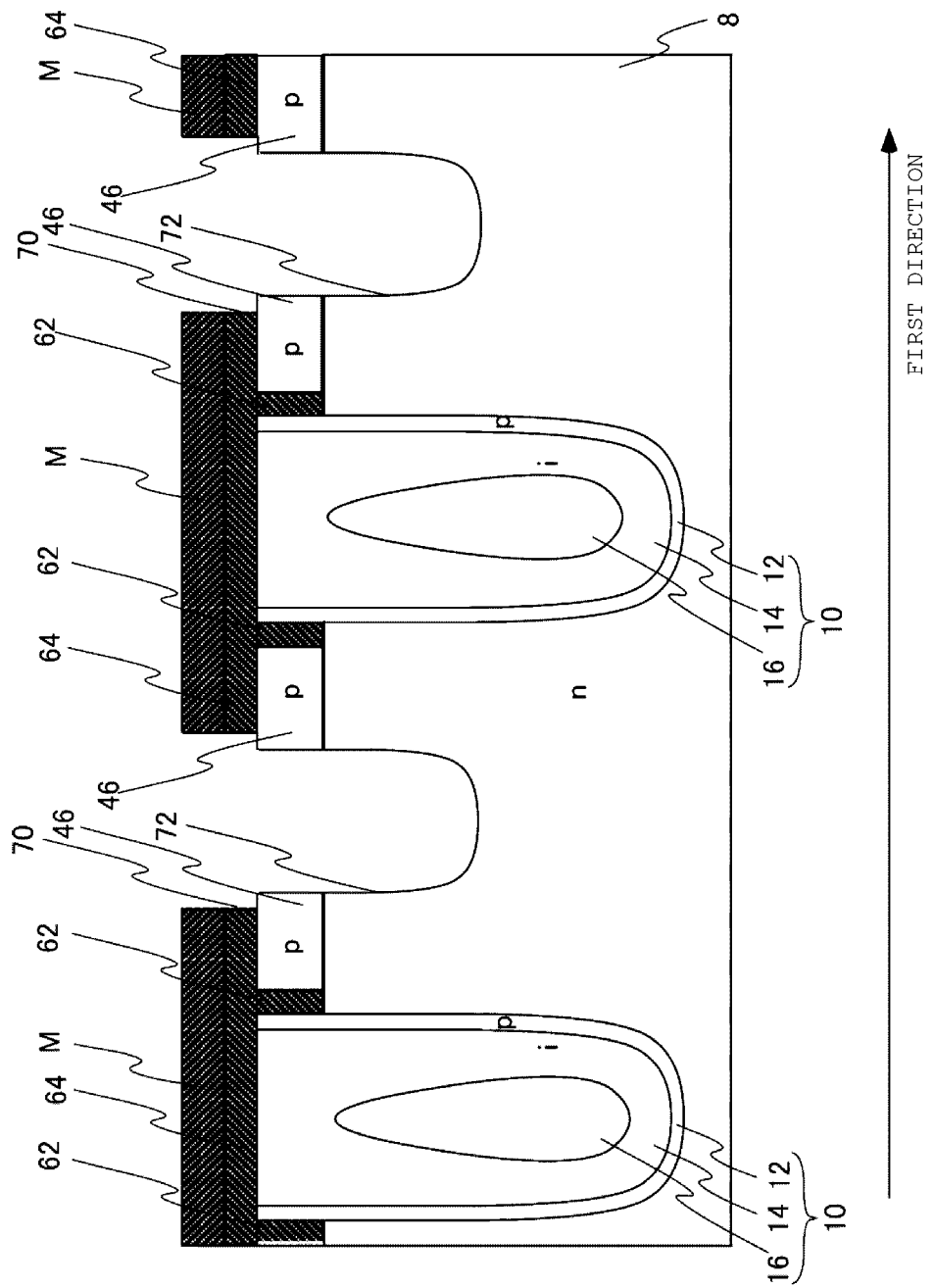

Subsequently, as illustrated in FIG. 10, a first opening 70 having a bottom portion on the sixth semiconductor region 46 is formed on the semiconductor layer 8 by, for example, patterning performed by photolithography and oxide film RIE. Subsequently, a second opening 72 having a bottom portion inside the semiconductor layer 8 is formed by silicon RIE. Subsequently, the second opening 72 is chamfered by chemical dry etching (CDE) in order to prevent leakage between a gate electrode and a source electrode. The second opening 72 becomes the second region 20.

Figure 11:
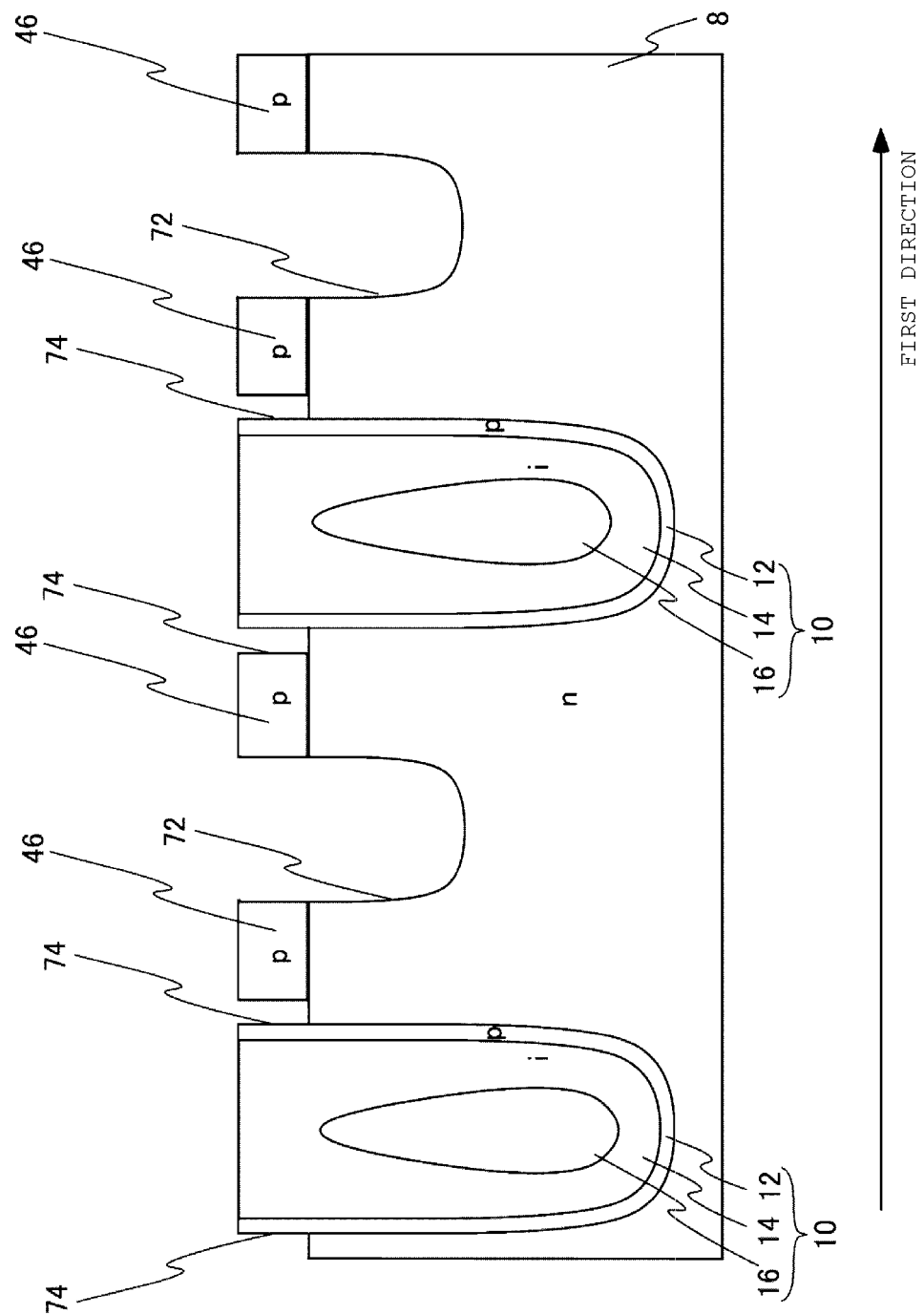

Subsequently, as illustrated in FIG. 11, the CVD film M and the third oxide film 64 are removed. As a result, a third opening 74 is formed. The third opening 74 becomes the third region 30 as will be described below.

Figure 12:
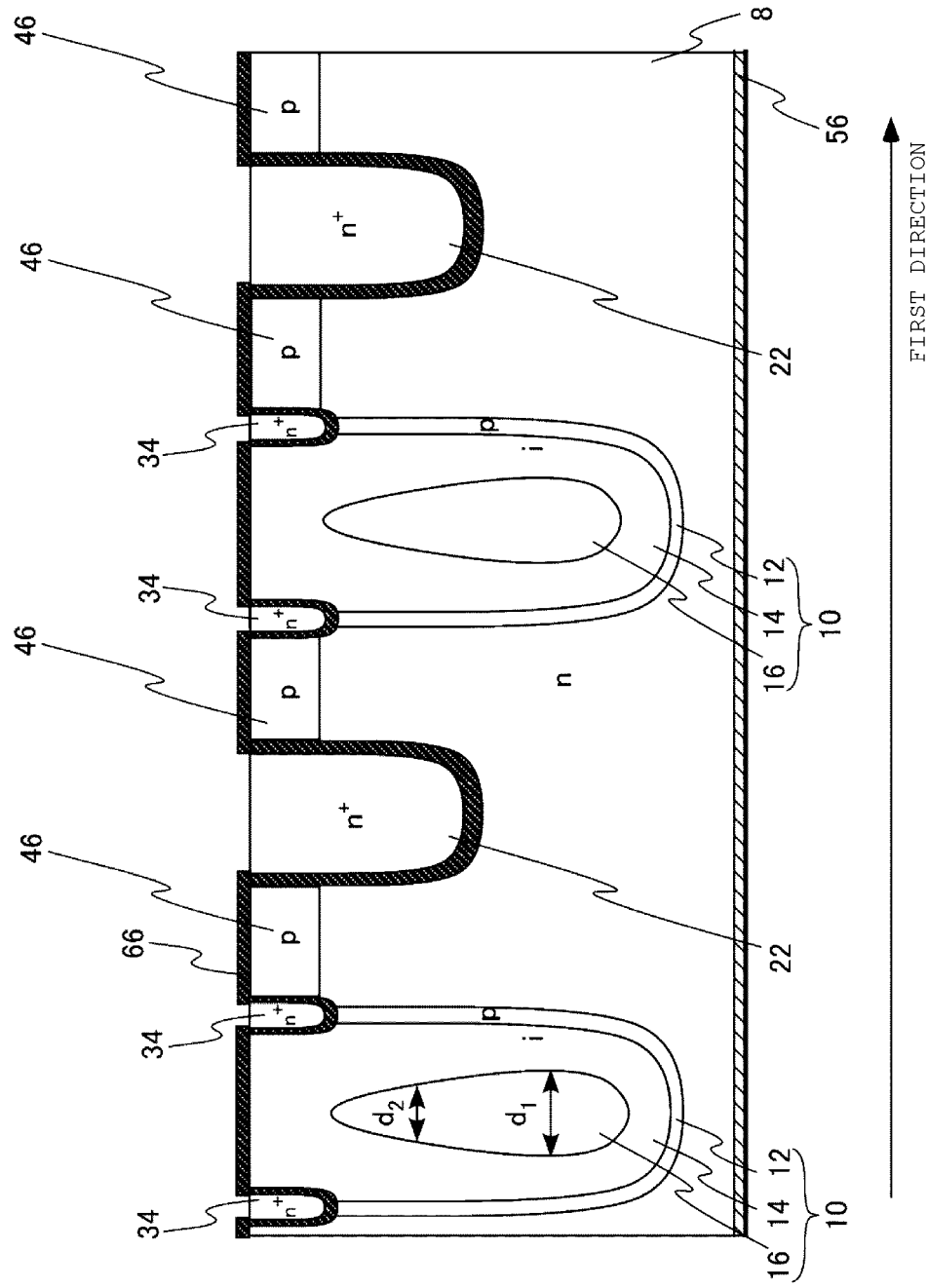

Subsequently, as illustrated in FIG. 12, a fourth oxide film 66 is formed inside the second opening 72 and the third opening 74, and on the sixth semiconductor region 46 of a p type, through, for example, a thermal oxide method, polycrystalline silicon is formed inside the second opening 72 and the third opening 74 through, for example, a CVD method, and phosphorous (P) which is an n type impurity is doped into the polycrystalline silicon using, for example, phosphoryl chloride POCL$_3$. As a result, the fourth semiconductor region 22 of an n type is formed inside the second region 20, and the fifth semiconductor region 34 of an n type is formed inside the third region 30.

Figure 13:
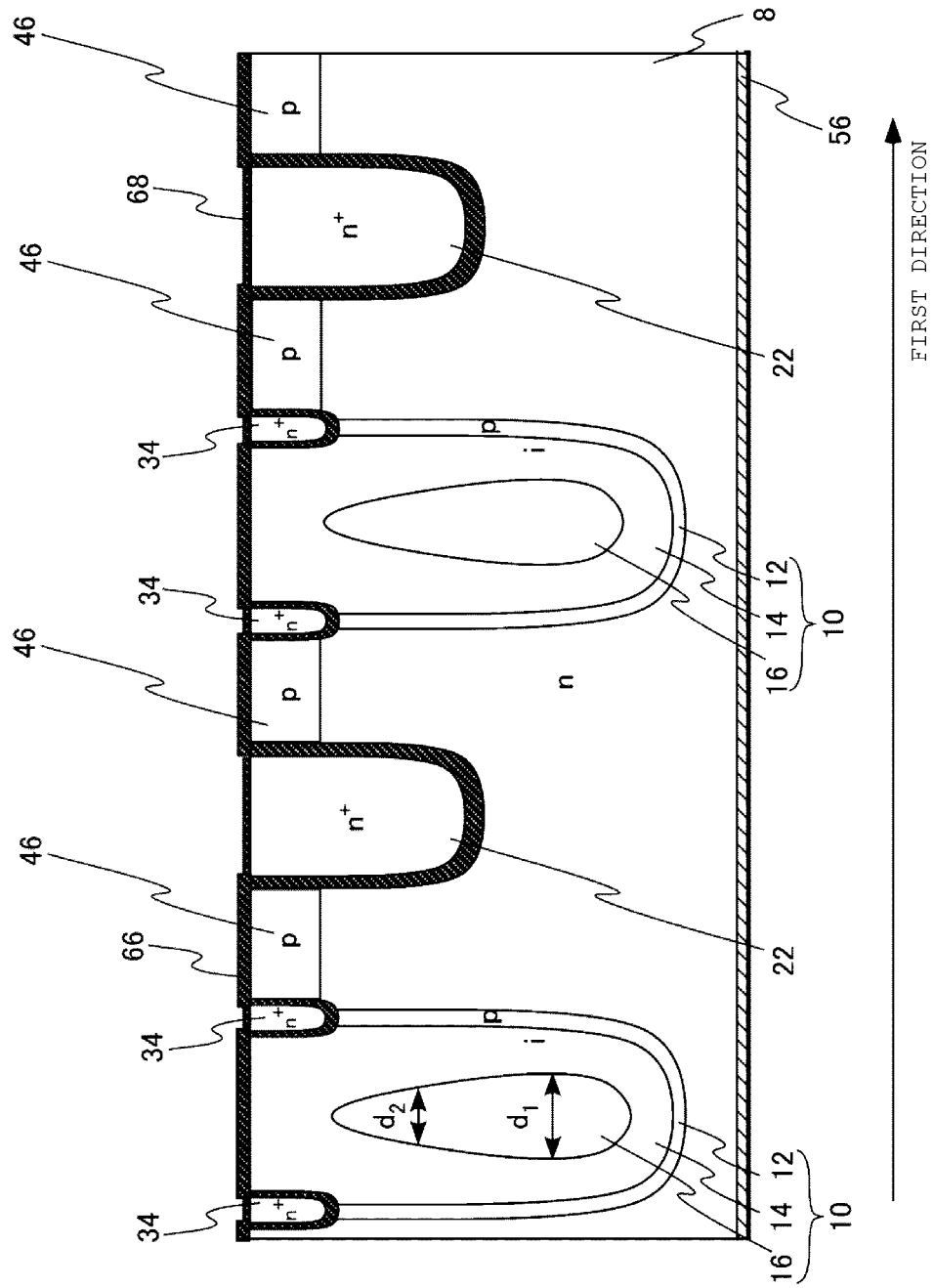

Subsequently, as illustrated in FIG. 13, a fifth oxide film 68 is formed on the fourth oxide film 66, the fourth semiconductor region 22, and the fifth semiconductor region 34, through, for example, a thermal oxide method.

Figure 14:
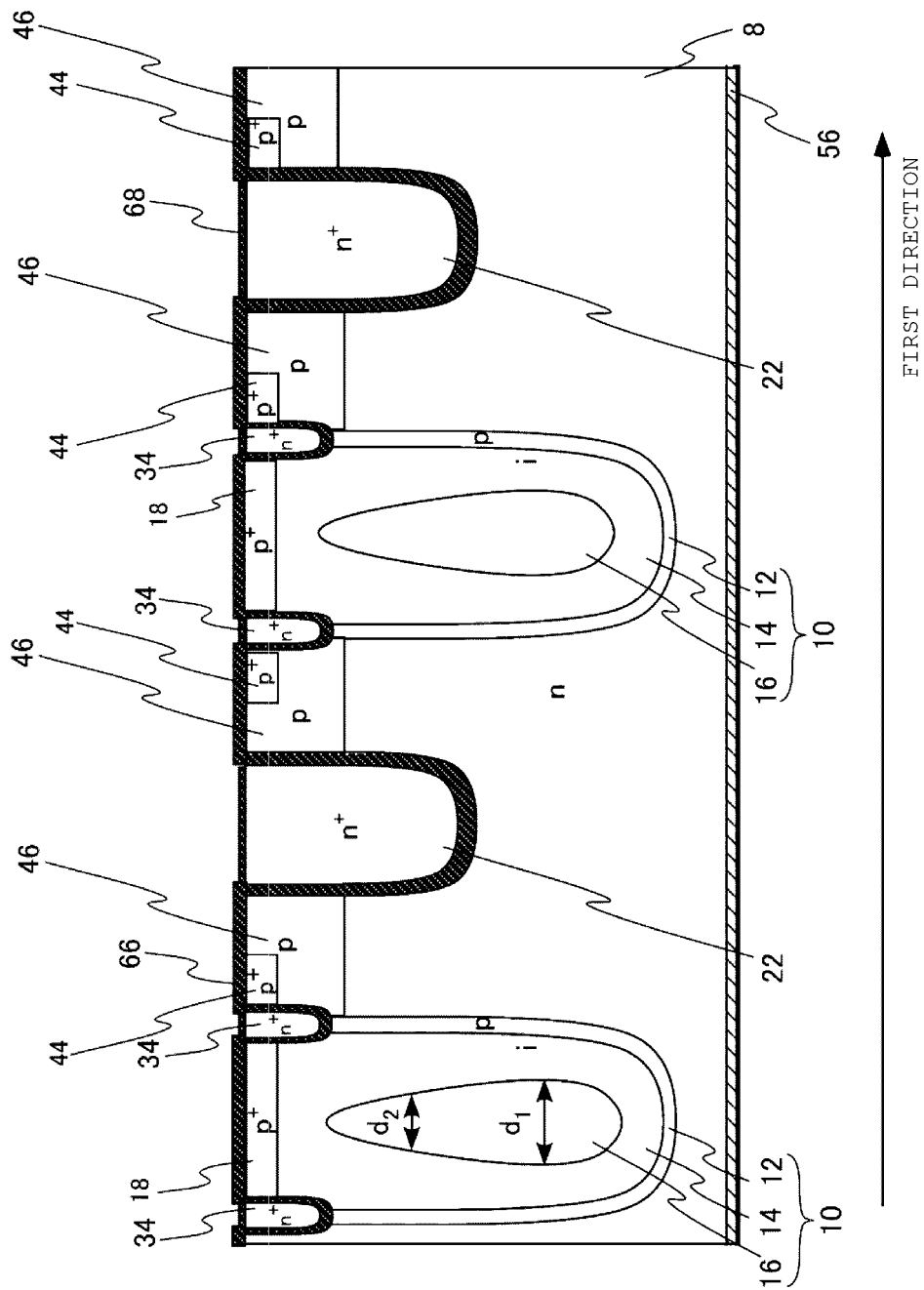

Subsequently, as illustrated in FIG. 14, the third semiconductor region 18 of a p$^+$ type is formed on the eighth semiconductor region 14, and the second semiconductor region 44 of a p$^+$ type is also formed between the first region 10 and the second region 20, by an ion implantation method. Thereafter, a p type impurity is diffused by performing first thermal processing, for example, in a temperature higher than or equal to 900° C. and lower than or equal to 1,100° C. The p type impurity inside the third semiconductor region 18 and a p type impurity inside the seventh semiconductor region are diffused into the eighth semiconductor region 14. In addition, as the p type impurity of the sixth semiconductor region 46 is downwardly diffused, the sixth semiconductor region 46 is downwardly expanded.

Figure 15:
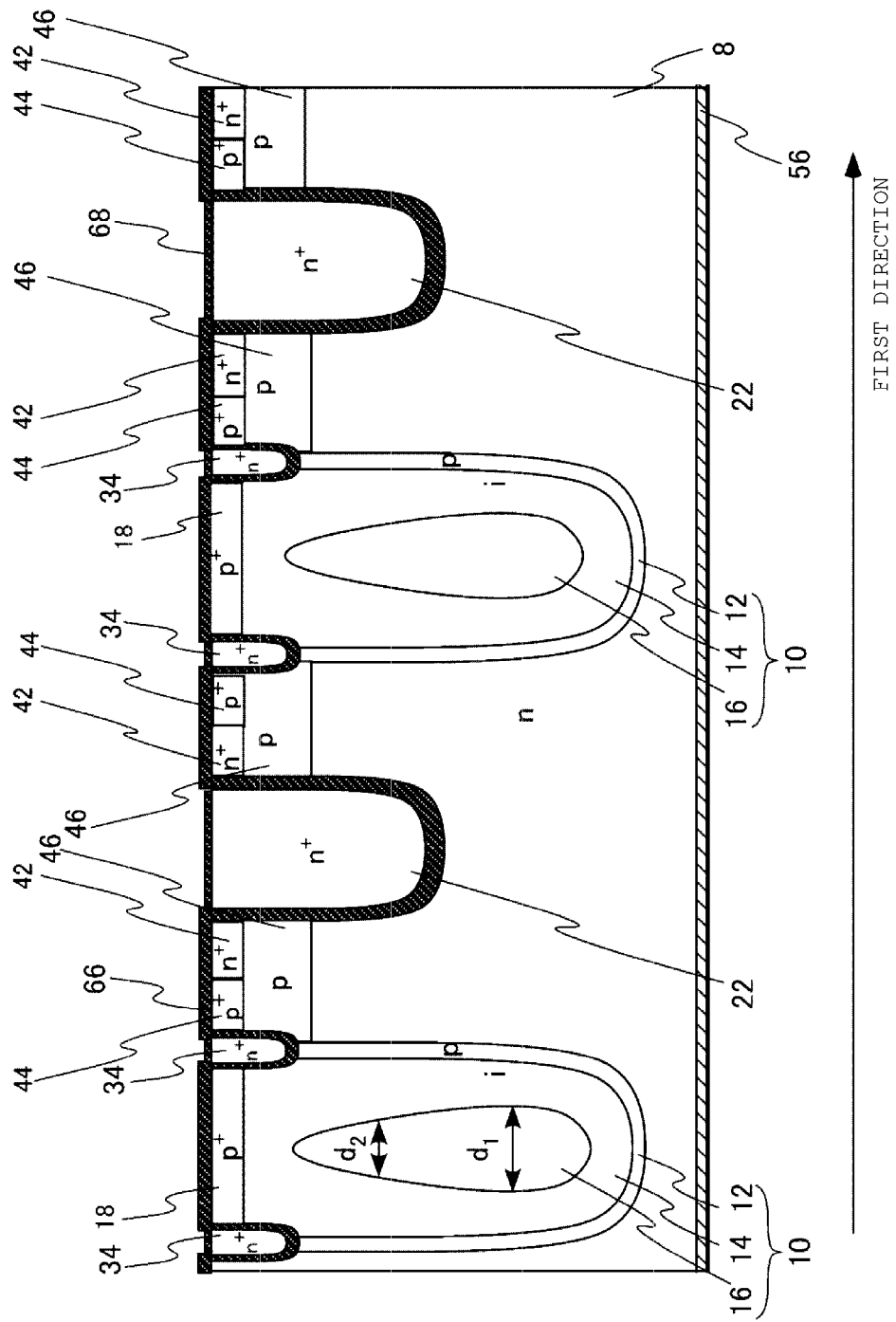

Subsequently, as illustrated in FIG. 15, the first semiconductor region 42 of an n$^+$ type is formed between the first region 10 and the second region 20 by an ion implantation method. As a result, the sixth semiconductor region 46 of a p type is formed under the first semiconductor region 42 and the second semiconductor region 44. Thereafter, the n type impurity is diffused by performing second thermal processing, for example, in a temperature higher than or equal to 900° C. and lower than or equal to 1,100° C. As the p type impurity of the sixth semiconductor region 46 is downwardly diffused, the sixth semiconductor region 46 is downwardly expanded.

The p type impurity inside the sixth semiconductor region 46 is diffused into the eighth semiconductor region 14 by the first thermal processing or the second thermal processing.

Figure 16:
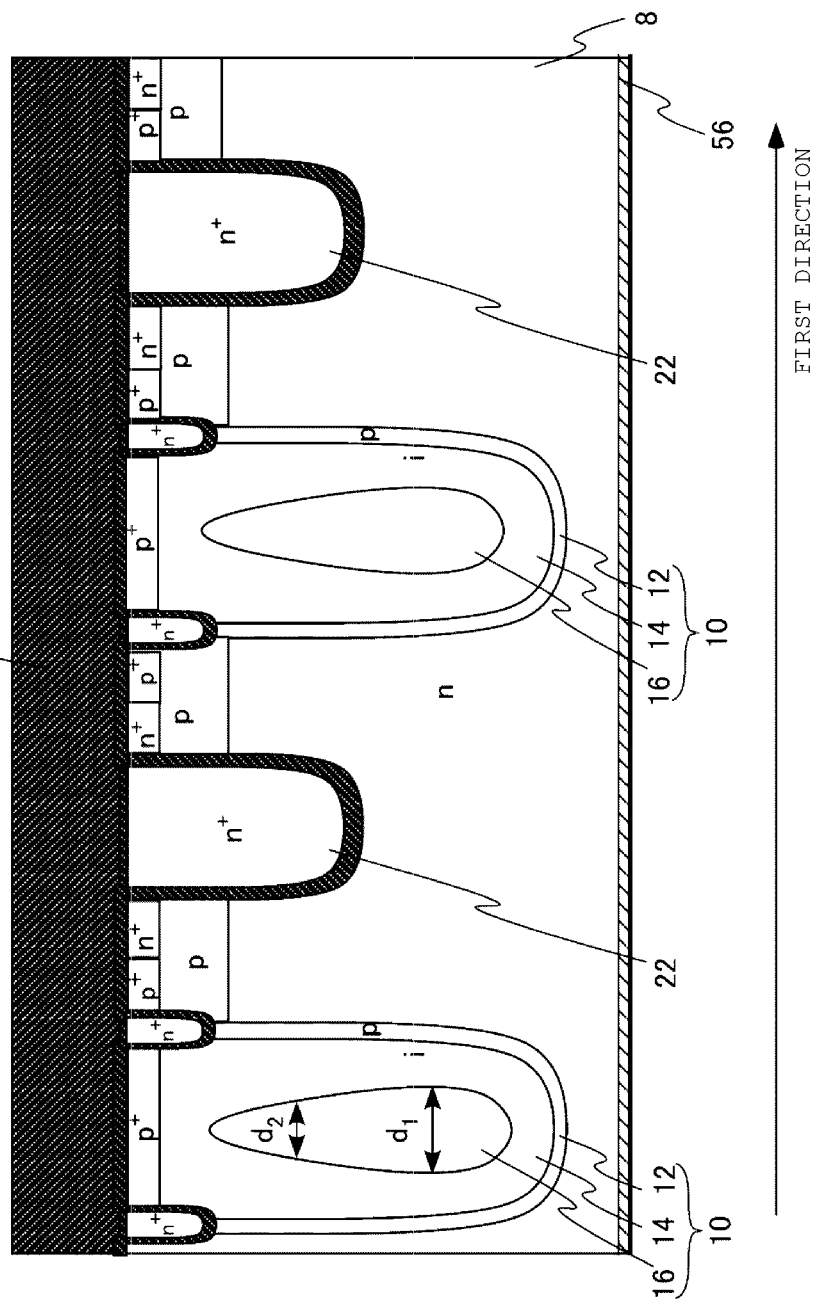

Subsequently, as illustrated in FIG. 16, a film 50 which includes NSG and BPSG is formed on the fifth oxide film 68, and thermal processing is performed.

Figure 17:
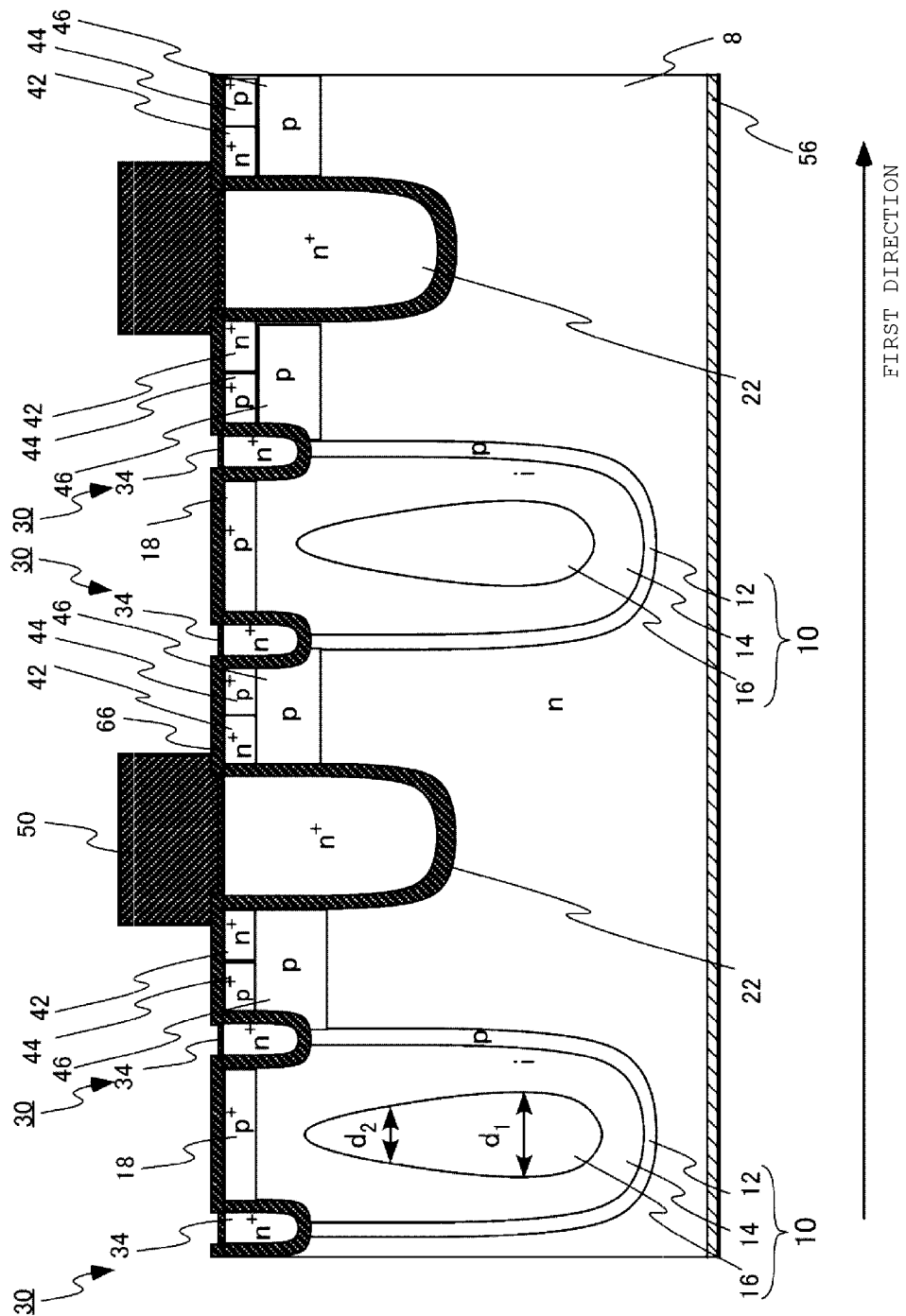

Subsequently, as illustrated in FIG. 17, a portion of the film 50 is removed, whereby the third insulator material 50 is formed on the second region 20.

Subsequently, the barrier metal 52 is formed on the first region 10, the second region 20, the third region 30, the first semiconductor region 42 of an n type, the second semiconductor region 44 of a p type, and the third insulator material 50, the source electrode 54 is formed on the barrier metal 52, the drain electrode 56 is formed under the semiconductor layer 8, whereby the semiconductor device 100 is obtained.

Subsequently, actions and effects of the semiconductor device 100 according to the first embodiment will be described.

As will be described below, in the semiconductor device 100 according to the first embodiment, by using the side wall 62 as a CMP stopper, opening of an upper portion of the empty hole 16 is prevented, and liquid or the like used for a fabrication process does not flow into the empty hole 16. In the fabrication process, a portion in which the side wall 62 is formed becomes the third region 30 of the semiconductor device 100. That is, the semiconductor device 100 including the third region is fabricated so as to prevent the opening of the upper portion of the empty hole 16, and thus it is possible to increase reliability (stability) of the semiconductor device 100. Furthermore, since the third region 30 includes the second insulator material 32, an electric resistance around the third region 30 increases, and it is possible to prevent unintended electrical coupling between the first region 10 and the second region 20.

In addition, by forming the sixth semiconductor region through epitaxial growth, it is possible to prevent concentration of super junction from being cancelled by heat, as compared to formation of a base area performed by ion injection and high temperature diffusion of the related art. Thus, it is possible to fabricate a semiconductor device with a low ON resistance.

By further including a third semiconductor region containing a second conductive type impurity provided on the first region, the second conductive type impurity is also injected from not only the seventh semiconductor region arranged on a lower portion and a side portion of the first region, but also an upper portion of the semiconductor device 100, and thus it is possible to provide the semiconductor device 100 with further stable characteristics.

By further including the third insulator material 50, insulation properties between the source electrode 54 and the fourth semiconductor region 22 of an n type is ensured.

Subsequently, actions and effects of the fabrication method of the semiconductor device 100 will be described.

By allowing formation of the empty hole 16 in the seventh semiconductor region 12 of a p type, it is possible to form more rapidly the eighth semiconductor region 14. However, for example, if the eighth semiconductor region 14 is ground by CMP or the like shortly after the semiconductor device in the process of fabrication illustrated in FIG. 4, the upper portion of the empty hole 16 can be opened. If that is the case, resist, slurry which is used for CMP, or the like would flow into the empty hole 16, and thus it may be difficult to continue to perform the fabrication process.

In the fabrication method of the semiconductor device 100 according to the present embodiment, however, the side wall 62 is formed, and thereafter CMP is performed by using the side wall 62 as a CMP stopper. Accordingly, it is possible to prevent the upper portion of the empty hole 16 from being opened. As a result, it is possible to continue to perform the fabrication process.

Since the $d_1$ is larger than $d_2$, regions in which holes are generated when the semiconductor device 100 operates are widened. Accordingly, the semiconductor device 100 can perform a stable operation.

As described above, according to the semiconductor device 100 and the fabrication method thereof according to the present embodiment, it is possible to provide a semiconductor device which can stabilize the characteristics of a super junction structure and a fabrication method thereof.

Second Embodiment

A semiconductor device 200 according to the present embodiment is different from the semiconductor device 100 according to the first embodiment in that the semiconductor device 200 includes a vertical MOSFET of a planar gate type with a super junction structure. Here, the same portions as in the first embodiment will not be described.

Figure 18:
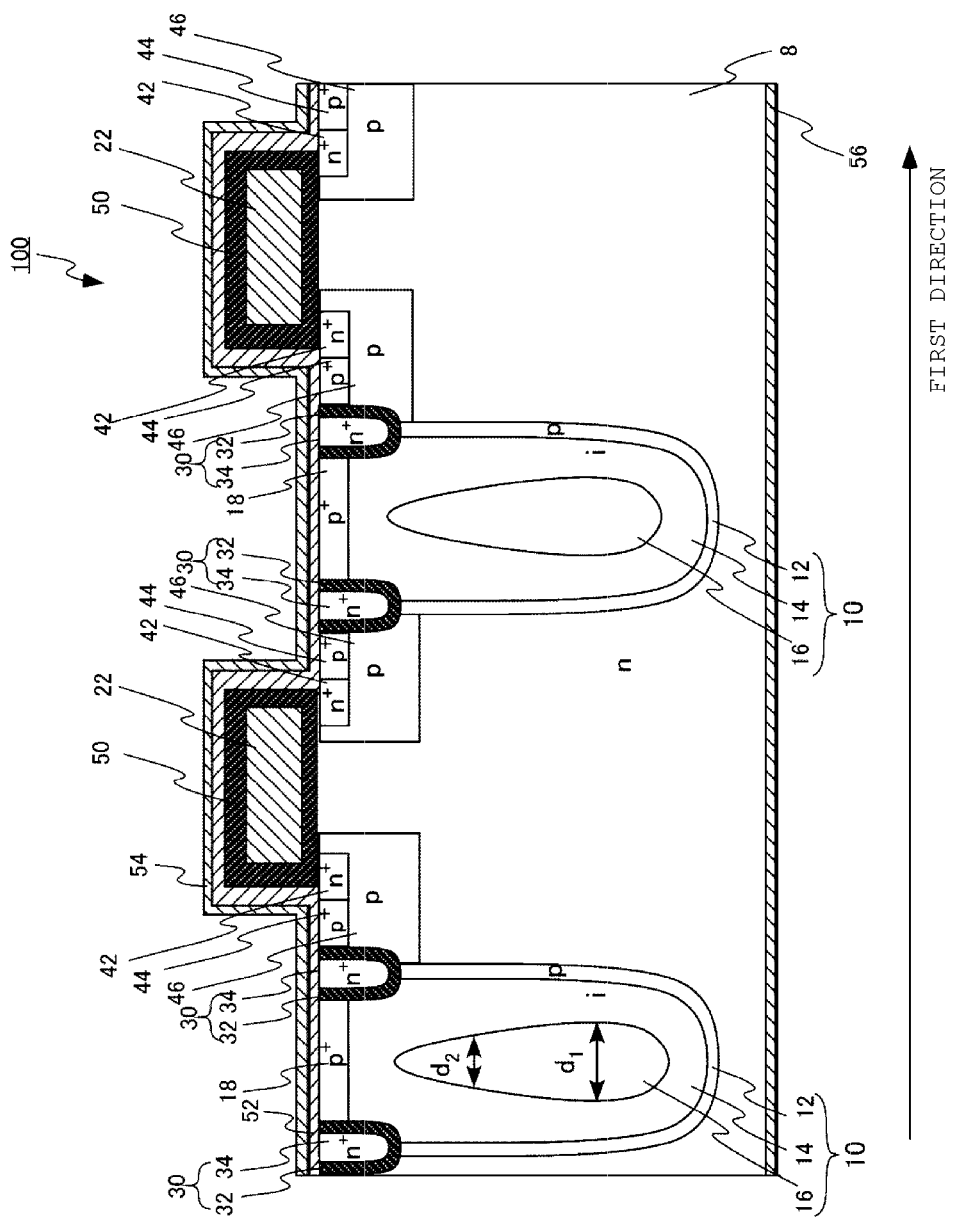
FIG. 18 is a sectional view of a semiconductor device according to a second embodiment.

FIG. 18 is a cross sectional view of the semiconductor device 200 according to the second embodiment. In the semiconductor device 200 and fabrication method thereof, it is also possible to provide a semiconductor device which can stabilize the characteristics of the super junction structure.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
a semiconductor layer of a first conductivity type;
a plurality of first regions that are spaced apart from each other along a first direction by portions of the semiconductor layer, each of the first regions including a first semiconductor region of a second conductivity type;
a second region between the first regions in the first direction, the second region including a second semiconductor region of the first conductivity type and a first insulator between the second semiconductor region and the semiconductor layer; and
a third region between the first region and the second region, the third region including a third semiconductor region of the first conductivity type and a second insulator.

2. The device according to claim 1, further comprising:
a fourth semiconductor region of the first conductivity type between the second region and the third region; and
a fifth semiconductor region of the second conductivity type between the third region and the first semiconductor region.

3. The device according to claim 1, wherein the first region has a hole that extends in a second direction orthogonal to the first direction, the hole having a smaller opening closer to the third region than farther from the third region.

4. The device according to claim 1, further comprising:
a barrier metal layer in contact with the third region;
a source electrode on the barrier metal layer; and
a drain electrode on the semiconductor layer.

5. The device according to claim 2, further comprising:
a sixth semiconductor region of the second conductivity type in the first region.

6. The device according to claim 3, wherein the first region includes an undoped semiconductor region and a semiconductor region of the second conductivity type between the hole and semiconductor layer.

7. The device according to claim 4, wherein the first region is closer to the drain electrode than the second region, and the second region is closer to the drain electrode than the third region.

8. The device according to claim 7, further comprising:
a third insulator between the barrier metal layer and second region, wherein
the barrier metal layer and the source electrode are formed on side surfaces of the third insulator.

9. A semiconductor device, comprising:
a semiconductor layer of a first conductivity type;
a plurality of first regions that are spaced apart from each other along a first direction by portions of the semiconductor layer, each of the first regions including a first semiconductor region of a second conductivity type in direct contact with the semiconductor layer, a hole, and an undoped semiconductor region between the hole and the first semiconductor region;
a second region including a second semiconductor region of the first conductivity type and a first insulator in direct contact with the semiconductor layer; and
a third region including a third semiconductor region of the first conductivity type and a second insulator in direct contact with the first semiconductor region and the undoped semiconductor region.

10. The device according to claim 9, further comprising:
a barrier metal layer in contact with the third region and the first insulator;
a source electrode on the barrier metal layer; and
a drain electrode on the semiconductor layer.

11. The device according to claim 10, wherein the first region is closer to the drain electrode than the third region, and the third region is closer to the drain electrode than the second region.

12. The device according to claim 11, wherein the first insulator surrounds the second semiconductor region so that the second semiconductor region is not in direct contact with the barrier metal layer or the semiconductor layer.

13. The device according to claim 12, wherein the barrier metal layer and the source electrode are formed on side surfaces of the first insulator.

14. A method of fabricating a semiconductor device, comprising:
forming in a first semiconductor layer of a first conductivity type, a plurality of first regions, each of the first regions having a first semiconductor region of a second conductivity type in direct contact with the first semiconductor layer, a hole, and an undoped semiconductor region between the hole and the first semiconductor region;
polishing the first regions until portions of a first insulator become exposed and are planar with the first regions;
removing the portions of the first insulator so that the first semiconductor layer is exposed and side walls are formed by the first regions;
forming a second insulator on the first regions, the first semiconductor layer and the side walls;
removing the second insulator except for portions on the side walls;
forming a second semiconductor layer of the second conductivity type on the first regions, the first semiconductor layer and the side walls;
polishing the second semiconductor layer using the portions of the second insulator on the side walls as a stopper; and
removing the portions of the second insulator on the side walls to form an opening and forming a second semiconductor region of the first conductivity type in the opening.

15. The method according to claim 14, wherein the second insulator is removed except for portions on the side walls by reactive ion etching.

16. The method according to claim 14, wherein a third insulator is formed in the opening before the second semiconductor region.

17. The method according to claim 14, further comprising:
after removing the portions of the second insulator on the side walls, thermally growing an oxide film on surfaces exposed by the opening; and
forming the second semiconductor region on the oxide film.

18. The method according to claim 17, further comprising:
forming a third semiconductor region of the first conductivity type between the first regions, the third semiconductor region separated from the first semiconductor layer by a third insulator.

19. The method according to claim 18, further comprising:
forming a barrier metal layer in contact with the second semiconductor region;
forming a source electrode on the barrier metal layer; and
forming a drain electrode on the first semiconductor layer.

20. The method according to claim 19, wherein the first region is closer to the drain electrode than the second semiconductor region, and the third semiconductor region is closer to the drain electrode than the second semiconductor region.

* * * * *